(12) United States Patent
Nakasuji (10) Patent No.: US 6,591,412 B2
(45) Date of Patent: Jul. 8, 2003

(54) METHODS FOR DIVIDING A PATTERN IN A SEGMENTED RETICLE FOR CHARGED-PARTICLE-BEAM MICROLITHOGRAPHY

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 2 days.

(21) Appl. No.: 10/000,186

(22) Filed: Nov. 30, 2001

(65) Prior Publication Data

US 2002/0115309 A1 Aug. 22, 2002

(30) Foreign Application Priority Data

Dec. 4, 2000 (JP) .......................... 2000-368669

(51) Int. Cl.⁷ .......................... G06F 17/50; H01L 21/00
(52) U.S. Cl. .......................... 716/21; 716/19; 438/795
(58) Field of Search .......................... 438/795, 798, 438/800; 716/19, 20, 21; 250/492.22, 492.3; 430/30

(56) References Cited

U.S. PATENT DOCUMENTS 6,225,013 B1 * 5/2001 Cohen et al. .................. 430/30

OTHER PUBLICATIONS

IBM Technical Disclosure Bulletin (NA80122774) entitled "Electron Beam Stitching Technique for Use in the Fabrication of Integrated Circuit Devices", Dec. 1980.*
U.S. patent application Ser. No. 09/514,985, Nakasuji, filed Feb. 29, 2000.

* cited by examiner

Primary Examiner—Evan Pert
(74) Attorney, Agent, or Firm—Klarquist Sparkman LLP (57) ABSTRACT

Methods are disclosed for dividing a pattern in a segmented reticle such as used in charged-particle-beam microlithography. In the methods, the reticle pattern is divided among multiple subfields delineated by respective initial subfield-boundary lines. In an exemplary embodiment, initial subfield-boundary lines are determined by determining respective extensions of pattern elements in each of the X and Y directions. For example, if the extension in the Y direction is longer than in the X direction, then an initial pattern division (including into complementary subfields as required) is made using the initial subfield-boundary extending in the X direction. If the pattern exhibits a period repeat in the Y direction, then the initial subfield-boundary lines are established at an integer multiple of half the period repeat. The initial subfield-boundary lines are then corrected by shifting the initial subfield-boundary lines as required such that the subfield-boundary lines extend through nearby "significant points" (bend points meeting certain predetermined criteria) of adjacent pattern elements.

37 Claims, 7 Drawing Sheets

METHODS FOR DIVIDING A PATTERN IN A SEGMENTED RETICLE FOR CHARGED-PARTICLE-BEAM MICROLITHOGRAPHY

FIELD

This disclosure pertains to microlithography (transfer of a pattern to a sensitive substrate), especially as performed using a charged particle beam. Microlithography is a key technology used in the fabrication of microelectronic devices such as integrated circuits, displays, and micromachines. More specifically, the disclosure pertains to charged-particle-beam (CPB) microlithography performed using a pattern-defining segmented reticle on which the pattern is divided into multiple subfields each defining a respective portion of the pattern, and to methods by which respective images of the subfields are transferred from the reticle to the substrate.

BACKGROUND

With the relentless drive to progressively smaller feature sizes (now less than 0.10 µm) the pattern-resolution limitations of optical microlithography have become a major limitation. To solve this problem, considerable effort currently is being expended to develop a practical "next generation" microlithography technology. A major effort to such end involves using a charged particle beam (e.g., an electron beam) as the lithographic energy beam. Charged-particle-beam (CPB) microlithography is expected to produce substantially better pattern resolution for reasons similar to the reasons for which electron microscopy yields better image resolution than optical microscopy.

Current CPB microlithography technology does not yet embody a solution to the problem of projecting an entire pattern in one shot from the reticle to the substrate. Rather, the pattern is divided into individual exposure units usually termed "subfields" that are defined on a "segmented" reticle and exposed in a prescribed order subfield-by-subfield. This exposure scheme is termed "divided-reticle pattern transfer." As can be surmised, the optical field of CPB optics required to transfer a single subfield is much smaller than otherwise would be required to transfer the entire pattern in one shot. During transfer of each subfield, the respective subfield image is formed on the substrate in a manner such that, when exposure is complete, the subfield images collectively form the entire contiguous pattern. The subfields typically are arrayed on the reticle in rows and columns, wherein each row has a length substantially equal to the diameter of the optical field of the CPB optical system. During exposure of a row of subfields, the charged particle beam is deflected laterally as required to transfer the subfields in the row in sequential order. In progressing from one row to the next, the reticle and substrate typically are mechanically scanned in opposite lateral directions.

Whenever a pattern is being transferred from a segmented reticle, it is desirable to achieve the greatest possible pattern-transfer accuracy. To such end, the subfield images are formed at respective locations on the substrate that desirably result in proper "stitching" together of the individual subfield images. Such stitching (i.e., positioning of respective subfield images) must be performed extremely accurately. However, in a practical sense, situations do arise in which adjacent subfield images are slightly misaligned with each other, resulting in a corresponding "stitching" error. Stitching errors can be manifest, for example, as shorts between adjacent wiring traces caused by overlap of one wiring trace over another, and as breaks in wiring traces that should be contiguous with each other. With increases in the number of intersections of adjacent subfields as imaged on the substrate and/or increases in the number of patterns elements per subfield that are joined together, the number of such faults tends to increase commensurately. In addition, in conventional segmented reticles, subfield boundaries sometimes are situated between the source and gate or between the gate and drain of a transistor of the pattern. In such a situation, a stitching error at the subfield boundary can cause the respective transistor simply not to function or to function improperly.

Japan Kôkai Patent Document No. Hei 9-97759 discloses a conventional method by which a pattern as defined on the reticle is divided into subfields. A plotter diagram of the pattern is evaluated so as to place subfield-division lines in respective locations that reduce intersections of the lines with pattern elements as much as possible. Unfortunately, in this method, pattern evaluation requires that an operator handle very large amounts of data; hence, data processing requires a long time to complete.

Whenever a pattern is divided to form a segmented reticle, situations frequently arise in which certain pattern elements cannot be defined entirely in a single subfield. For example, certain pattern elements inevitably result in the presence of "island," "donut," "peninsular," or other reticle features that are not self-supporting. In such instances, at least two complementary subfields must be used to define the respective pattern portion. U.S. Pat. No. 5,166,888 discloses a conventional method for dividing a pattern portion into complementary subfields. In the disclosed method, a stability value is assigned to each inside corner of the pattern element. The stability value is a function of the length of the perimeter of all edges between adjacent outside corners of the pattern element and the length of the shortest distance between the adjacent outside corners. Based on such data, pattern elements having a sub-threshold stability value are divided into multiple rectangular sections. The resulting sections are distributed between two complementary subfields. Unfortunately, this method tends to result in the element being divided up more than actually necessary, which results in a higher than acceptable incidence of stitching errors between adjacent sections of the element as transferred to the substrate.

Also, the methods summarized above are directed to, and thus have been applied only to, abstract artificial patterns rather than actual LSI patterns. Hence, there is a need for pattern-element division methods that are more applicable to actual LSI patterns.

SUMMARY

In view of the shortcomings of conventional methods as summarized above, this invention provides, inter alia, transfer-exposure methods for performing division of pattern elements that are more similar to actual LSI patterns, and that provide improved pattern-layering accuracy and reduced stitching errors.

To such end, and according to a first aspect of the invention, methods are provided for dividing a pattern to be defined on a segmented reticle for use in charged-particle-beam (CPB) microlithography. The pattern is divided into multiple subfields each defining a respective portion of the pattern. In an embodiment of such a method, the reticle pattern is initially divided using initial subfield-boundary lines that are spaced apart from one another according to a subfield dimension determined in advance. Then, the initial subfield-boundary lines are corrected to produce corrected subfield-boundary lines so as to correct pattern-element stitching when the pattern is transfer-exposed to the sensitive substrate.

If the pattern elements as defined on the reticle are arranged at certain respective pitches in the X direction and Y direction, then the initial subfield-boundary lines can be established at respective integer multiples of the respective pitches without, thereby, defining subfields that are larger than a maximum subfield size that can be exposed without excessive aberrations. In addition to dividing the reticle into subfields each defining a respective portion of the pattern, certain subfields can be divided as required into respective complementary subfields so as to avoid the "donut" problem and/or the "peninsula" problem. For example, in the reticle subfields that are divided into respective complementary subfields, each respective reticle subfield can be divided by at least one line extending in the X or Y direction at an interval of ¼ of the respective pitch or an integer multiple of ¼ of the respective pitch.

Typically, the reticle pattern has a minimum linewidth, wherein the respective integer multiples (between adjacent initial subfield-boundary lines) desirably are within a range of 50 to 500 times the minimum linewidth.

If the reticle pattern extends in X and Y directions along at least one of which the reticle pattern exhibits a cyclical period repeat, then the initial division step can include placing the initial subfield-boundary lines at an integer multiple of half the period repeat.

Typically, pattern elements in the reticle pattern include one or more respective "significant points" as defined herein. With respect to such pattern elements, if the respective significant points are located within a predetermined distance from the respective initial subfield-boundary lines, then the initial subfield-boundary lines desirably are corrected by shifting the respective lines so as to intersect the significant points. Furthermore, an initial subfield-boundary line can be shifted to intersect a significant point of a respective adjacent pattern element if the respective significant point defines an interior angle of at least 180°. If the respective significant point does not define an interior angle of at least 180°, then the initial subfield-boundary line can be shifted to intersect a significant point of a respective adjacent pattern element if the respective significant point defines an interior angle of less than 180°.

If the reticle pattern extends in X and Y directions along at least one of which the reticle pattern exhibits a regular cyclical repeat having a respective pitch, then, in the X or Y direction in which the reticle pattern exhibits the regular cyclical repeat, the corrected subfield-boundary line can extend through significant points located, relative to the respective initial subfield-boundary line, within ½ the respective pitch.

Desirably, in the correcting step, the corrected subfield-boundary lines are configured so as to intersect as few adjacent pattern elements as possible while intersecting the respective significant points.

In the initial-division step the initial subfield-boundary lines can be configured to extend in the X and Y directions so as to extend along pattern elements extending in a similar manner. In such an instance, in the correcting step each corrected subfield line can be configured to extend, within a respective pattern element, in at least one of the X and Y directions as the corrected subfield line connects together respective significant points of the respective pattern element. Additionally, in the correcting step each corrected subfield line can be configured to extend, outside a respective pattern element, parallel to at least one of the X and Y directions or at a slope relative to at least one of the X and Y directions. The slope can be within a range of ±45° or ±135° relative to the X or Y direction.

In any of the method variations summarized above, if the significant points are located within 20 times the minimum linewidth of the respective initial subfield-boundary lines, then the initial subfield-boundary lines can be corrected by shifting the respective lines so as to intersect the significant points.

In any of the method variations summarized above, if the significant points are located within a distance, determined in advance, no greater than 20 times the minimum linewidth of the respective initial subfield-boundary lines, then the initial subfield-boundary lines can be corrected by shifting the respective lines so as to intersect the significant points.

In any of the method variations summarized above, after the reticle pattern has been initially divided (using the initial subfield-boundary lines), calculations for determining the respective locations of the "corrected" subfield-boundary lines need only involve data pertaining to the vicinity of the initial subfield-boundary lines. Consequently, data-processing and calculation time is substantially reduced compared to conventional methods. In addition, human intervention is not necessary for dividing the pattern, and the pattern can be divided completely using automated equipment.

Furthermore, the pattern is not subdivided more than necessary, thereby substantially reducing stitching errors between adjacent subfields as projected onto the substrate, or between complementary subfields as projected onto the substrate. Moreover, the methods disclosed herein are readily applicable to actual LSI patterns. "Significant points" are defined later below. In any event, the significant points are respective loci at which the consequences of a joining error (generally termed a "stitching error") are relatively minor. Thus, by dividing the pattern along lines extending through significant points of adjacent pattern elements, it is possible to improve layering accuracy between successive pattern layers applied to a substrate.

The foregoing and additional features and advantages of the invention will be more readily apparent from the following detailed description, which proceeds with reference to the accompanying drawings.

DETAILED DESCRIPTION

This invention is described below in connection with representative embodiments that are not intended to be limiting in any way.

Figure 2:
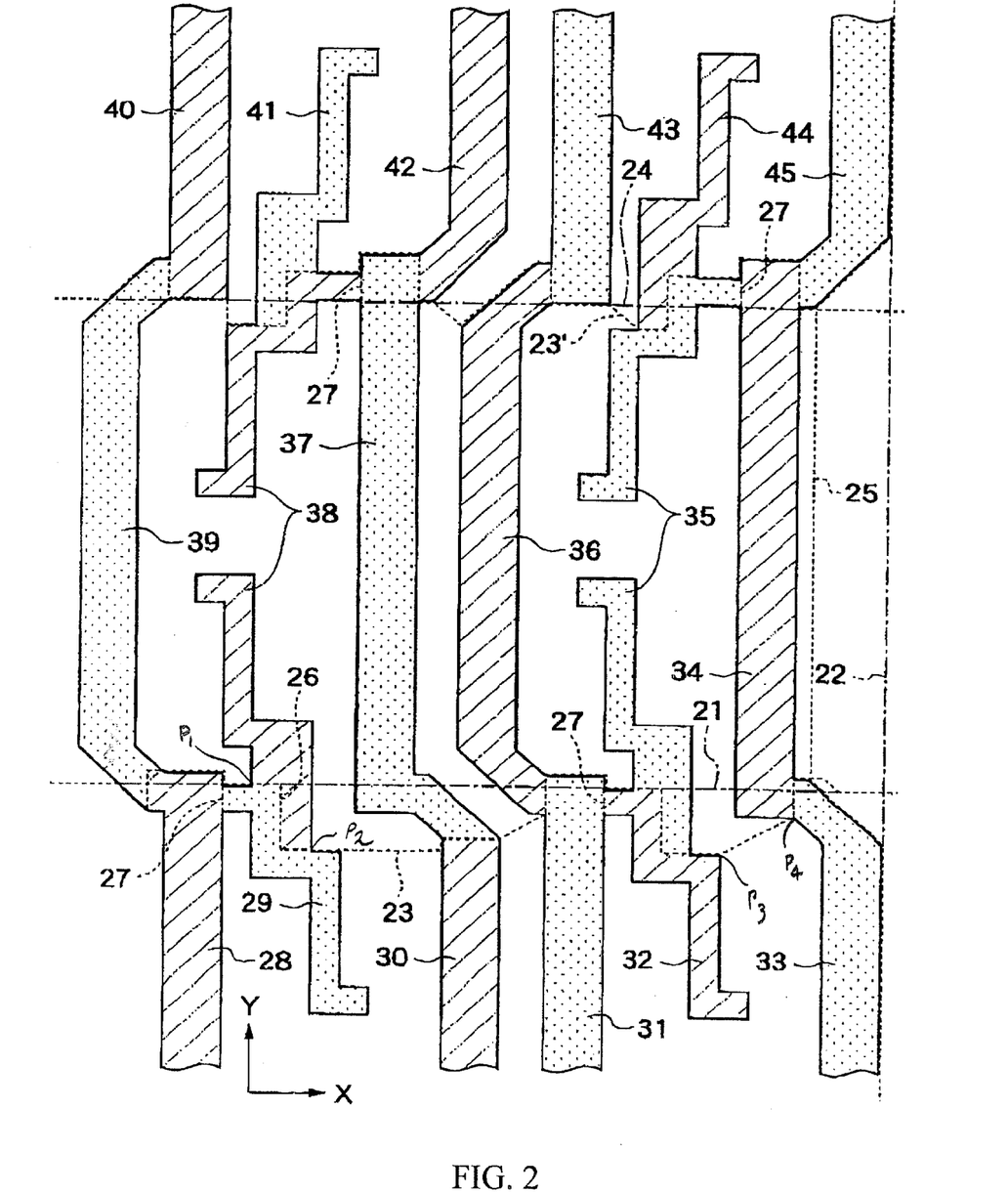
FIG. 2 is a plan view schematically showing the relationship between an exemplary array of pattern elements, in a polysilicon layer, for gate electrodes and the subfield boundary, wherein pattern division has been performed according to the second representative embodiment.
Figure 4:
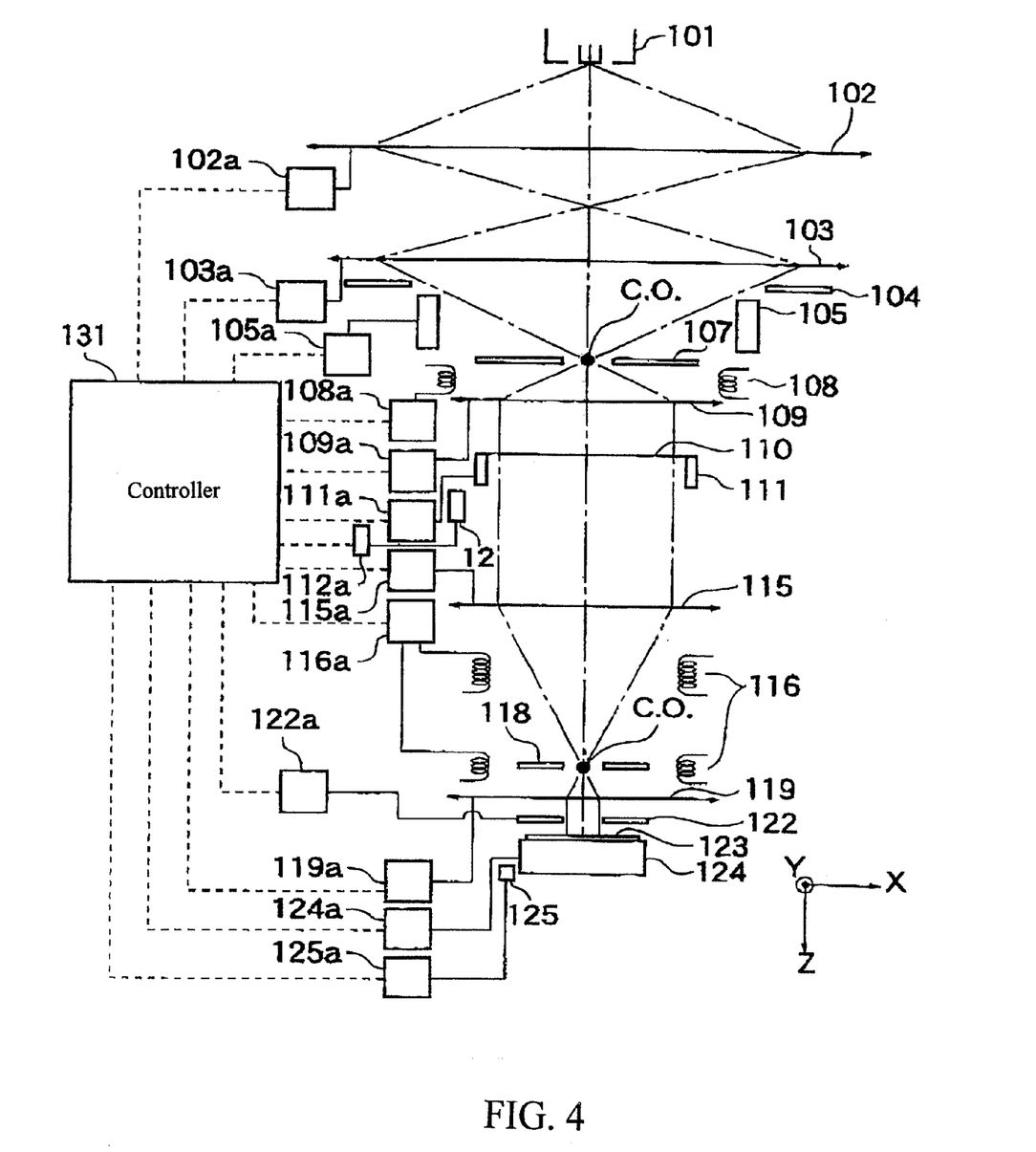
FIG. 4 is an elevational schematic diagram of imaging relationships and control systems of a CPB microlithography apparatus employing a segmented reticle according to the invention.

FIG. 4 is a schematic elevational diagram of a charged-particle-beam (CPB) divided-reticle projection microlithography system incorporating certain aspects of the invention. The system of FIG. 4 is described in the context of using an electron beam as an exemplary charged-particle lithographic energy beam. It will be understood that the principles of the system shown in FIG. 4 can be applied with equal facility to use with another type of charged particle beam such as an ion beam. FIG. 2 also depicts general imaging and control relationships of the subject system.

Situated at the extreme upstream end of the system is an electron gun 101 that emits an electron beam propagating in a downstream direction generally along an optical axis Ax. Downstream of the electron gun 101 are a first condenser lens 102 and a second condenser lens 103 collectively constituting a two-stage condenser-lens assembly. The condenser lenses 102, 103 converge the electron beam at a crossover C.O. situated on the optical axis Ax at a blanking diaphragm 107.

Downstream of the second condenser lens 103 is a "beam-shaping diaphragm" 104 comprising a plate defining an axial aperture (typically rectangular in profile) that trims and shapes the electron beam passing through the aperture. The aperture is sized and configured to trim the electron beam sufficiently to illuminate one exposure unit (subfield) on the reticle 110. An image of the beam-shaping diaphragm 104 is formed on the reticle 110 by an illumination lens 109.

The electron-optical components situated between the electron gun 101 and the reticle 110 collectively constitute an "illumination-optical system" of the depicted microlithography system. The electron beam propagating through the illumination-optical system is termed an "illumination beam" because it illuminates a desired region of the reticle 110. As the illumination beam propagates through the illumination-optical system, the beam actually travels in a downstream direction through an axially aligned "beam tube" (not shown but well understood in the art) that can be evacuated to a desired vacuum level.

A blanking deflector 105 is situated downstream of the beam-shaping aperture 104. The blanking deflector 105 laterally deflects the illumination beam as required to cause the illumination beam to strike the aperture plate of the blanking diaphragm 107, thereby preventing the illumination beam from being incident on the reticle 110.

A subfield-selection deflector 108 is situated downstream of the blanking diaphragm 107. The subfield-selection deflector 108 laterally deflects the illumination beam as required to illuminate a desired reticle subfield situated within the optical field of the illumination optical system. Thus, subfields of the reticle 110 are sequentially scanned by the illumination beam in a horizontal direction (X direction in the figure). The illumination lens 109 is situated downstream of the subfield-selection deflector 108.

The reticle 110 typically defines many subfields (e.g., tens of thousands of subfields). The subfields collectively define the pattern for a layer to be formed at a single die ("chip") on a lithographic substrate. The reticle 110 is mounted on a movable reticle stage 111. Using the reticle stage 111, by moving the reticle 110 in a direction (Y and/or X direction) perpendicular to the optical axis Ax, it is possible to illuminate the respective subfields on the reticle 110 extending over a range that is wider than the optical field of the illumination-optical system. The position of the reticle stage 111 in the XY plane is determined using a "position detector" 112 typically configured as a laser interferometer. A laser interferometer is capable of measuring the position of the reticle stage 111 with extremely high accuracy in real time.

Situated downstream of the reticle 110 are first and second projection lenses 115, 119, respectively, and an imaging-position deflector 116. The illumination beam, by passage through an illuminated subfield of the reticle 110, becomes a "patterned beam" because the beam has acquired an aerial image of the illuminated subfield. The patterned beam is imaged at a specified location on a substrate 123 (e.g., "wafer") by the projection lenses 115, 119 collectively functioning as a "projection-lens assembly." To ensure imaging at the proper location, the imaging-position deflector 116 imparts the required lateral deflection of the patterned beam, as described later below with reference to FIG. 6.

So as to be imprintable with the image carried by the patterned beam, the upstream-facing surface of the substrate 123 is coated with a suitable "resist" that is imprintably sensitive to exposure by the patterned beam. When forming the image on the substrate, the projection-lens assembly "reduces" (demagnifies) the aerial image. Thus, the image as formed on the substrate 123 is smaller (usually by a defined integer-ratio factor termed the "demagnification factor") than the corresponding region illuminated on the reticle 110. By thus causing imprinting on the surface of the substrate 123, the apparatus of FIG. 4 achieves "transfer" of the pattern image from the reticle 110 to the substrate 123.

The components of the depicted electron-optical system situated between the reticle 110 and the substrate 123 are collectively termed the "projection-optical system." The substrate 123 is situated on a substrate stage 124 situated downstream of the projection-optical system. As the patterned beam propagates through the projection-optical system, the beam actually travels in a downstream direction through an axially aligned "beam tube" (not shown but well understood in the art) that can be evacuated to a desired vacuum level.

The projection-optical system forms a crossover C.O. of the patterned beam on the optical axis Ax at the rear focal plane of the first projection lens 115. The position of the crossover C.O. on the optical axis Ax is a point at which the axial distance between the reticle 110 and substrate 123 is divided according to the demagnification ratio. Situated between the crossover C.O. (i.e., the rear focal plane) and the reticle 110 is a contrast-aperture diaphragm 118. The contrast-aperture diaphragm 118 comprises an aperture plate that defines an aperture centered on the axis Ax. With the contrast-aperture diaphragm 118, electrons of the patterned beam that were scattered during transmission through the reticle 110 are blocked so as not to reach the substrate 123.

A backscattered-electron (BSE) detector 122 is situated immediately upstream of the substrate 123. The BSE detector 122 is configured to detect and quantify electrons backscattered from certain marks situated on the upstream-facing surface of the substrate 123 or on an upstream-facing surface of the substrate stage 124. For example, a mark on the substrate 123 can be scanned by a beam that has passed through a corresponding mark pattern on the reticle 110. By detecting backscattered electrons from the mark at the substrate 123, it is possible to determine the relative positional relationship of the reticle 110 and the substrate 123.

The substrate 123 is mounted to the substrate stage 124 via a wafer chuck (not shown but well understood in the art), which presents the upstream-facing surface of the substrate 123 in an XY plane. The substrate stage 124 (with chuck and substrate 123) is movable in the X and Y directions. Thus, by simultaneously scanning the reticle stage 111 and the substrate stage 124 in mutually opposite directions, it is possible to transfer each subfield within the optical field of the illumination-optical system as well as each subfield outside the optical field to corresponding regions on the substrate 123. The substrate stage 124 also includes a "position detector" 125 configured similarly to the position detector 112 of the reticle stage 111.

Each of the lenses 102, 103, 109, 115, 119 and deflectors 105, 108, 116 is controlled by a controller 131 via a respective coil-power controller 102a, 103a, 109a, 115a, 119a and 105a, 108a, 116a. Similarly, the reticle stage 111 and substrate stage 124 are controlled by the controller 131 via respective stage drivers 111a, 124a. The position detectors 112, 125 produce and route respective stage-position signals to the controller 131 via respective interfaces 112a, 125a each including amplifiers, analog-to-digital (A/D) converters, and other circuitry for achieving such ends. In addition, the BSE detector 122 produces and routes signals to the controller 131 via a respective interface 122a.

From the respective data routed to the controller 131, as a subfield is being transferred the controller 131 ascertains, inter alia, any control errors of the respective stage positions. To correct such control errors, the imaging-position deflector 116 is energized appropriately to deflect the patterned beam. Thus, a reduced image of the illuminated subfield on the reticle 110 is transferred accurately to the desired target position on the substrate 123. This real-time correction is made as each respective subfield image is transferred to the substrate 123, and the subfield images are positioned such that they are properly stitched together on the substrate 123.

Figure 5A:
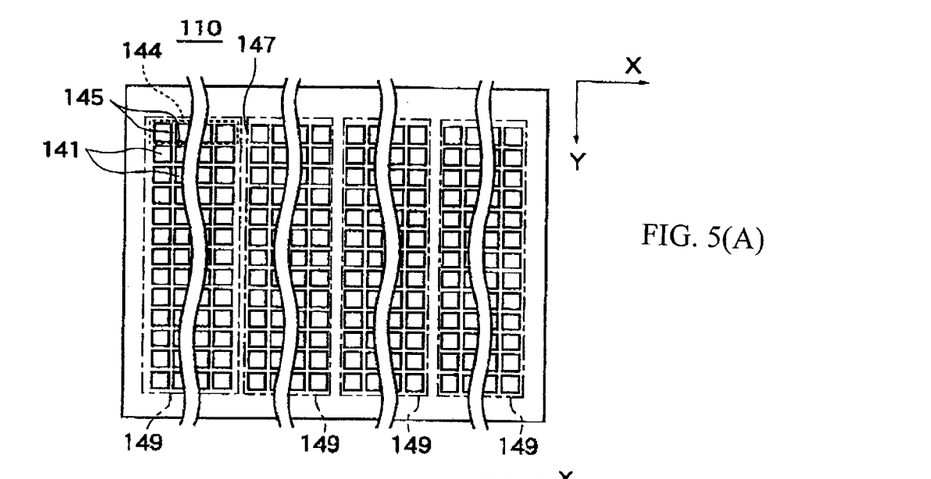
FIG. 5(A) is a plan view showing general aspects of a segmented reticle as used, for example, in the apparatus of FIG. 4.
Figure 5B:
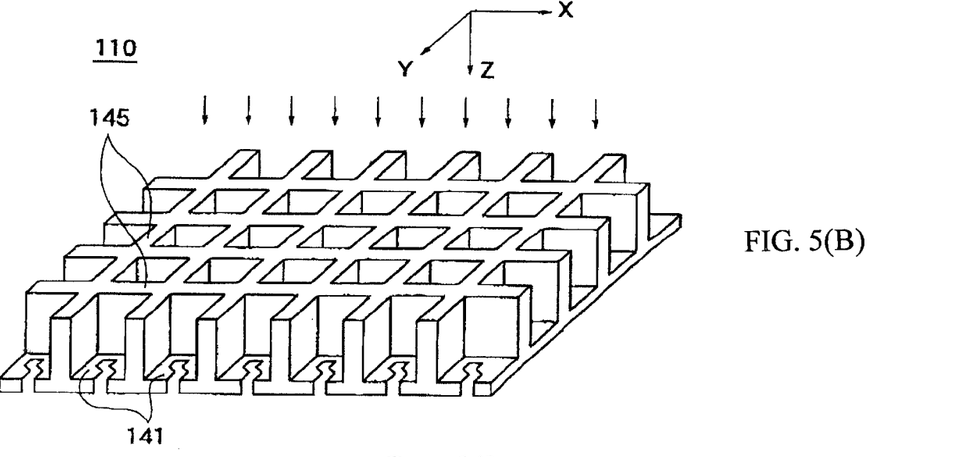
FIG. 5(B) is an oblique view of a portion of the reticle shown in FIG. 5(A).
Figure 5C:
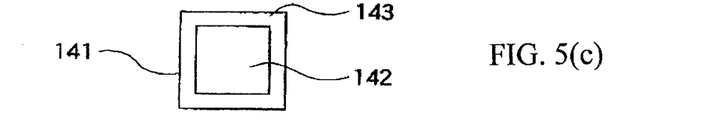
FIG. 5(C) is a plan view of a single subfield of the reticle of FIG. 5(A).

Details of an exemplary divided reticle 110 as used with the system of FIG. 4 are shown in FIGS. 5(A)–5(C). FIG. 5(A) is a plan view, FIG. 5(B) is an oblique view of a portion of the reticle, and FIG. 5(C) is a plan view of a single subfield. The depicted reticle 110 can be manufactured by electron-beam direct writing and etching of a silicon wafer, for example.

FIG. 5(A) shows the general configuration of the entire reticle 110. In the figure, multiple regions 149 are shown each including a large respective array of subfields 141. The regions 149 are termed "stripes," and each stripe 149 extends in the Y direction. Each stripe 149 includes multiple rows 144 of subfields 141, wherein each row 144 extends in the X direction. Each subfield 141 comprises a respective portion of the reticle membrane. Depending somewhat upon the particular type of reticle (stencil reticle or scattering-membrane reticle), the membrane has a thickness of, e.g., 0.1 $\mu$m to several $\mu$m. In the depicted configuration, the subfields 141 in each row 144 and the rows 144 in each stripe 149 are separated from each other by respective "minor struts" 145. The stripes 149 are separated from each other by major struts 147.

As shown in FIG. 5(C), each subfield 141 comprises a respective pattern-defining region 142 surrounded by a skirt 143. In a particular subfield 141, the respective pattern-defining region 142 defines the pattern features of the respective portion of the pattern defined by that subfield 141. The skirt 143 is not patterned. During exposure of the particular subfield 141, only the respective pattern-defining region 142 is transferred; the respective skirt 143 is not transferred. The edges of the illumination beam incident on the subfield fall within the respective skirt 143. As discussed above, the reticle 110 can be a stencil type or a scattering-membrane type. I.e., either type of reticle 110 can be used with the apparatus of FIG. 4, for example.

The currently practicable size of the membrane area 142 of a single subfield 141 is approximately 0.5 to 5 mm square on the reticle 110. At a demagnification ratio of 1/5, for example, the size of the reduced subfield image as projected onto the substrate 123 is approximately 0.1 to 1 mm square.

The minor struts 145 intersect with each other at right angles to form a lattice of "grillage" that strengthens and confers rigidity to the reticle 110. By way of example, the minor struts 145 are each about 0.5 to 1 mm thick (in the Z direction) and about 0.1 mm wide (in the X or Y direction); the skirt 143 is about 0.05 mm wide, for example. The grillage includes the major struts 147 that confer additional rigidity and strength to the reticle 100. The major struts 147 are contiguous with the minor struts 145.

The rows 144 shown in FIG. 5(A) are also known as "electrical stripes" because exposure of each row involves an electrically induced deflection of the illumination and patterned beams using the subfield-selection and imaging-position deflectors 108, 116, respectively. Similarly, the stripes 149 shown in FIG. 5(A) are also known as "mechanical stripes" because exposure of a full stripe 149 involves mechanical movement of the reticle 110 and substrate 123 by the reticle stage 112 and substrate stage 124, respectively. Hence, multiple subfields 141 are arrayed in the X direction in the figure to form each electrical stripe 144, and multiple electrical stripes 144 are arrayed in the Y direction to form each mechanical stripe 149. The length of an electrical stripe 144 (equal to the width of the corresponding mechanical stripe 149) corresponds to the width of the optical field of the illumination-optical system (which corresponds to the width of a range of deflection achievable by the subfield-selection deflector 108).

As an alternative to the reticle configuration shown in FIGS. 5(A)–5(C), a segmented reticle can comprise electrical stripes in which the respective subfields are not separated from each other. In other words, in such an alternative reticle, the constituent subfields of each electrical stripe are contiguous with each other with no intervening minor struts 145 or skirts 143. However, minor struts 145 (and skirts) are still present between adjacent electrical stripes of a mechanical stripe, and major struts 147 are still present between adjacent mechanical stripes. During exposure of this type of segmented reticle, the constituent subfields of an electrical stripe are exposed in a continuous lateral scanning sweep of the illumination beam along the electrical stripe.

According to an effective exposure method, and referring further to the reticle 110 shown in FIG. 5(A), the subfields 141 in a selected electrical stripe 144 within a selected mechanical stripe 149 are sequentially illuminated by appropriate deflections of the illumination beam in the X direction. Successive electrical stripes 144 in the selected mechanical stripe 149 are exposed by continuous scanning motions of the stages 111, 124.

Figure 6:
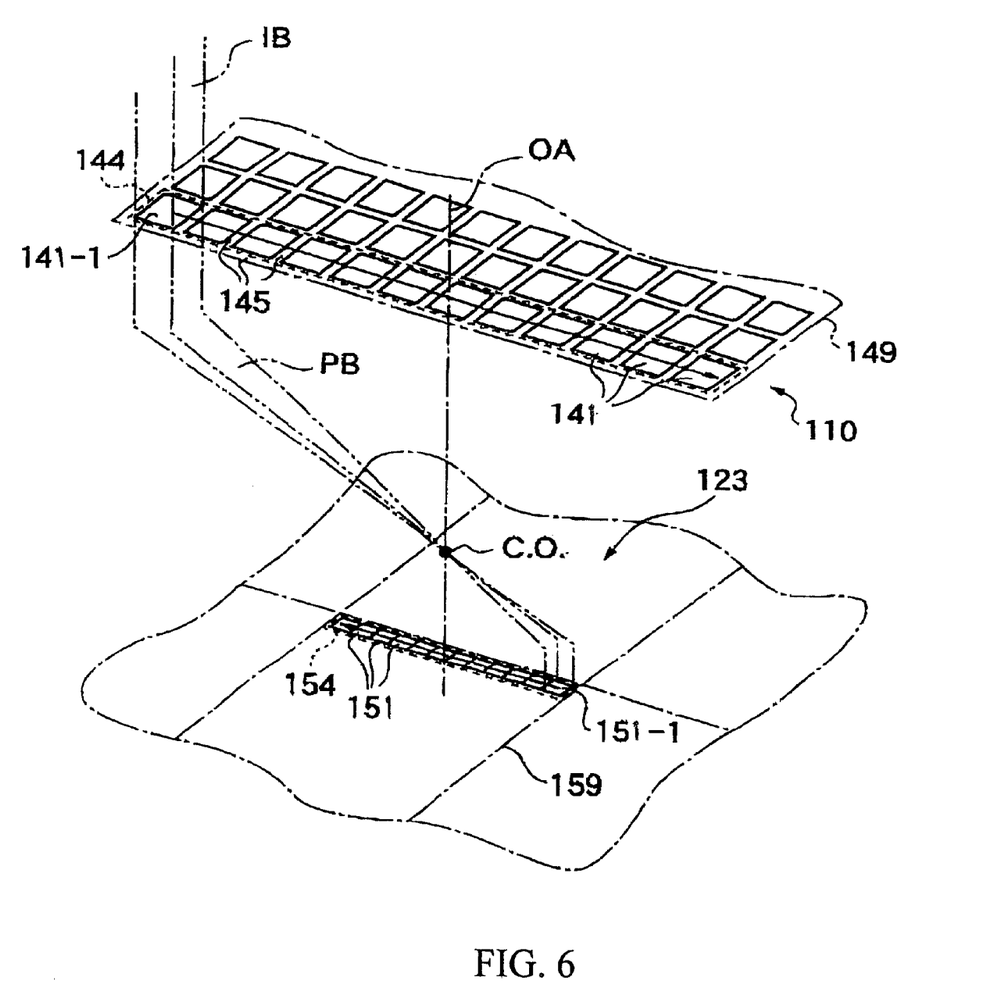
FIG. 6 is an oblique view that schematically depicts exposure of successive subfields of the reticle of FIG. 5(A), and placement of the resulting subfield images on a substrate.

General aspects of the exposure process summarized above are shown in FIG. 6. Shown at the upper portion of the figure is an end of one mechanical stripe 149 on the reticle 110, wherein the end is shown containing three electrical stripes 144. As described above, each electrical stripe 144 contains multiple constituent subfields 141 (individual patterned membrane portions 142 and skirts 143 are not shown) separated from each other by intervening minor struts 145. Minor struts 145 also separate individual electrical stripes 144 from each other in the mechanical stripe 149. Downstream of the reticle 110 along the optical axis OA is a corresponding region of the substrate 123 situated in opposition to the reticle. In the figure, the subfield 141-1 in the left corner of the electrical stripe 144 nearest the viewer is being illuminated by the illumination beam IB propagating from upstream. The resulting patterned beam PB downstream of the illuminated subfield 141-1 is being exposed (by the projection-lens assembly 115, 119, not shown) onto a corresponding region 151-1 on the surface of the substrate 123. As can be seen, the image in the region 151-1 is reduced (demagnified) relative to the corresponding subfield 141-1. The position of the region on the substrate surface at which the image is formed is achieved by action of the imaging-position deflector 116 (FIG. 4).

Between the reticle 110 and the substrate 123, the patterned beam PB is deflected twice by the collective action of the projection lenses 115, 119. The first deflection (performed by the first projection lens 115) is from a direction parallel to the optical axis OA to a direction in which the patterned beam intersects the optical axis OA. The second deflection (performed by the second projection lens 119) is a reverse of the first deflection.

The exact position 151 on the surface of the substrate 123 at which a transferred subfield image is formed is established such that the respective subfield images are contiguous with one another with no intervening spaces or the like. The respective positions 151 of the subfield images relative to each other typically correspond to the respective positions of the corresponding subfields 141 on the reticle 110. As noted above, this alignment of individual subfield images on the substrate 123 is achieved by appropriate deflections of the patterned beam by the imaging-position deflector 116 (FIG. 4). The subfield images as formed on the substrate 123 lack intervening grillage and skirts. To eliminate the grillage and skirts, the respective transfer position of each subfield image 151 is appropriately shifted by an amount that corresponds to the combined widths of the non-patterned skirt 143 and minor strut 145 associated with the subfield on the reticle.

This positional adjustment of subfield images on the substrate 123 must be performed in both the X and Y directions, and is achieved by appropriate deflections of the patterned beam as mediated by the imaging-position deflector 116.

Figure 1A:
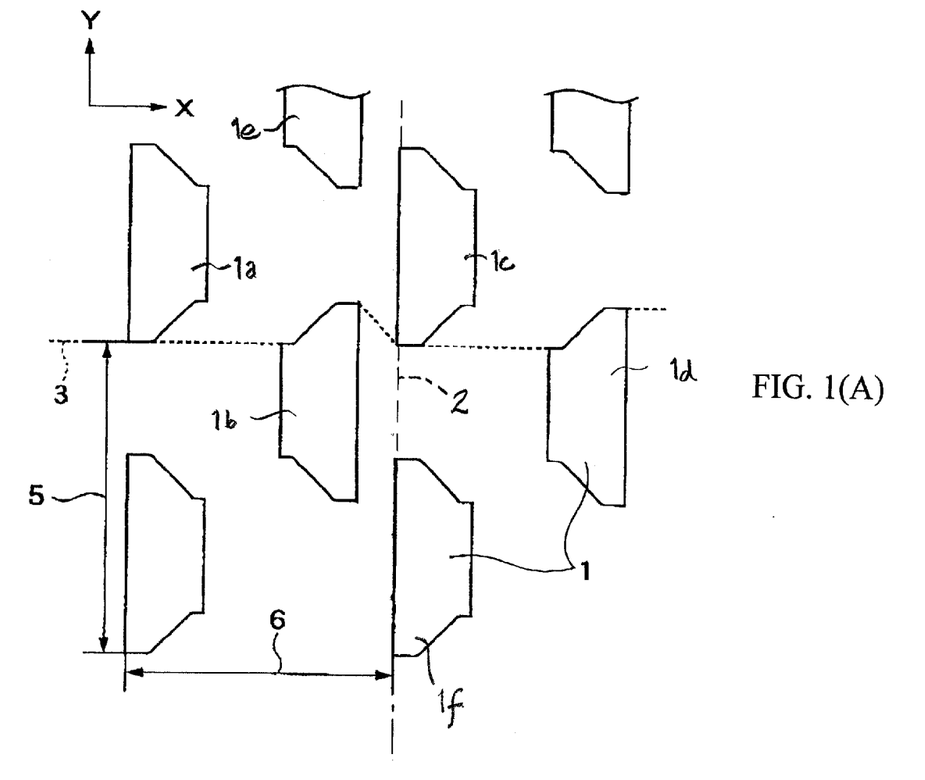
FIG. 1(A) is a plan view schematically showing the relationship between an exemplary array of P-well pattern elements and the subfield boundary, in a situation in which pattern division has been performed according to the first representative embodiment.

A first representative embodiment of the subject method for dividing a pattern is described with reference to FIGS. 1(A)–1(B). FIG. 1(A) is a plan view schematically showing exemplary subfield boundaries, determined according to the embodiment, relative to an array of P-well pattern elements. More specifically, FIG. 1(A) depicts P-well elements 1 to be formed on an N-type silicon wafer. Each of the P-well elements 1 has a trapezoidal profile. In the figure, the trapezoidal elements are oriented sideways, and at a certain respective pitch 6 in the X direction and a certain respective pitch 5 in the Y direction. By way of example, the X-direction pitch is 7.5 $\mu$m, and the Y-direction pitch is 15 $\mu$m on the reticle.

In FIG. 1(A), the subfield-boundary lines (i.e., "corrected" boundary lines) determined according to this embodiment are denoted by the dashed lines 2, 3. In the figure, the Y-direction subfield-boundary line 2 extends vertically in the center, along the respective right edges of the P-well pattern elements 1 in the second column from the left. The X-direction subfield-boundary line 3 extends horizontally in the figure, along the respective upper edges of the P-well pattern elements 1 in the second and fourth columns, and along the respective bottom edges of the P-well pattern elements 1 in the first and third columns.

Now assume that, on a segmented reticle, a representative subfield in which aberrations can be satisfactorily controlled is square-shaped with maximum dimensions of 250 $\mu$m×250 $\mu$m. Hence, in this example in which the pattern has an X-direction pitch of 7.5 $\mu$m, the X dimension of each subfield can be, without exceeding the maximum respective subfield dimension, 32(7.5 $\mu$m)=240 $\mu$m. Similarly, in this example in which the pattern has a Y-direction pitch of 15 $\mu$m, the Y dimension of each subfield can be, without exceeding the maximum respective subfield dimension, 16(15 $\mu$m)=240 $\mu$m, thereby providing a subfield having dimensions of 240 $\mu$m square. When commencing division of the pattern according to this embodiment, an initial division is performed to form subfields each dimensioned 240 $\mu$m×240 $\mu$m. In this division, the "initial" subfield-boundary lines are linear. In this embodiment, it is possible to make each subfield dimension the closest integer multiple of the respective pitch length, while still avoiding any need to extend subfield-boundary lines across pattern elements. Desirably, the resulting subfield dimensions are as close as possible to the desired subfield dimensions while preserving the desired subfield profile (e.g., square) and without exceeding the desired subfield dimensions.

Next, the initial subfield-boundary lines are "corrected" so as to reduce stitching errors of pattern elements between adjacent subfields as projected onto the substrate. To perform correction, the pattern elements in the vicinity of the initial subfield-boundary lines (i.e., the respective pattern elements closest to or adjacent the initial subfield-boundary lines, or respective pattern elements within a predetermined distance from the initial subfield-boundary lines) are evaluated. As a result of this evaluation, the initial subfield-boundary lines may be shifted relative to the adjacent pattern elements so as to form "corrected" subfield-boundary lines extending along certain edges of these pattern elements and intersect nearby "significant points" of the respective elements wherever possible.

The range of "nearby" is determined in advance, and normally is within a patterned region within the subfield or, at maximum, is within the subfield patterned region plus the area occupied by a skirt surrounding the subfield patterned region. Desirably, this range is within 20 times the minimum linewidth of the pattern. If there are no significant points "nearby" an initial subfield-boundary line, then no shifting of that initial subfield-boundary line is performed.

A "significant point" is a point on a pattern element at which the edge of the element is "bent" (i.e., makes a turn, as at a corner of the element). Optimally, a significant point is a locus at which the respective bend defines an interior angle of at least 180°. Alternatively, the criterion for a significant point can be a locus at which the interior angle is less than 180° if a significant point representing an interior angle >180° is not available. For example, in FIG. 1(A), the corrected X-direction boundary line 3 extends left-to-right in the figure along the "bottom" edge of the element 1a (and thus intersects two significant points of that element), the "top" edge of the element 1b (and thus intersects four significant points of that element), the "bottom" edge of the element 1c (and thus intersects two significant points of that element), and the "top" edge of the element 1d (and thus intersects four significant points of that element). Similarly, the corrected Y-direction boundary line 2 extends along the "left" edge of each of the elements 1c, 1f (and thus intersects two significant points of each of these elements).

After establishing the locations and configurations of the corrected subfield-boundary lines as described above, the reticle pattern is divided accordingly into subfields, and transfer-exposure of the pattern is performed subfield-by-subfield. Because the arrangement of the P-well pattern elements 1 in each respective subfield is similar, data used to perform division of the pattern can be processed in a short amount of time, compared to the time required to process data for pattern division according to conventional methods. Data-processing time also is reduced because evaluations are performed only in the vicinity of the initial subfield-boundary lines rather than over the entire reticle pattern.

An advantage to dividing the pattern in the manner shown in FIG. 1(A) is that division of individual pattern elements into complementary pattern-element portions is avoided. For comparison purposes, FIG. 1(B) shows a P-well pattern element divided according to the scheme disclosed in U.S. Pat. No. 5,166,888, cited above. As evident in the figure, the pattern element 1 has been divided by two division lines 13, thereby forming three complementary pattern-element portions 15, 16, 17. As can be seen by comparing FIG. 1(A) with FIG. 1(B), the pattern-division scheme according to this embodiment does not result in the splitting up of individual pattern elements 1. Thus, the pattern is not divided more than necessary, which yields a substantial reduction in stitching errors on the substrate. (By not subdividing individual pattern elements into complementary pattern-element portions, the problem of stitching errors between pattern-element portions as projected onto the substrate is eliminated.)

Figure 1B:
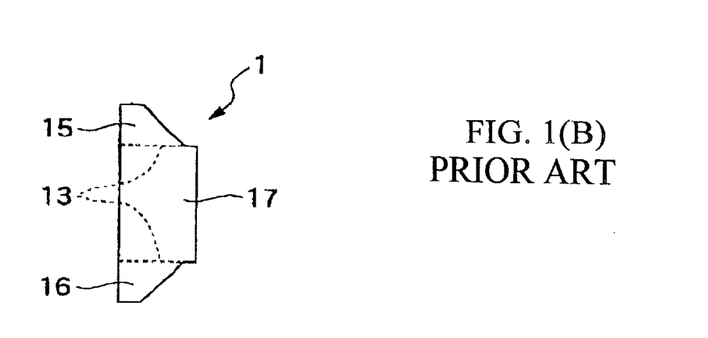
FIG. 1(B) is a plan view showing complementary division of a P-well pattern element by the conventional method disclosed in U.S. Pat. No. 5,166,888.

I.e., whenever pattern division is performed in the manner shown in FIG. 1(B), there is a risk that the complementary portions 15, 16, 17 will be inaccurately joined together, or joined improperly, on the substrate. In the division scheme shown in FIG. 1(A), in contrast, division across individual pattern elements 1 is unnecessary and hence does not occur.

A second representative embodiment of dividing a pattern is discussed with reference to FIG. 2. FIG. 2 is a plan view of exemplary pattern elements (specifically gate electrodes) to be formed in a polysilicon layer on a substrate. The pattern elements shown in FIG. 2 have substantially more complex profiles than the elements 1 shown in FIG. 1(A). Also, in FIG. 2, the pattern elements (typical of gate elements) extend mostly in one direction (in the vertical direction (Y direction) in the figure). The pattern elements in FIG. 2 also exhibit appreciable extension in the horizontal direction (X direction). Hence, it is likely that at least subfield boundaries extending in the X direction will cross individual pattern elements.

FIG. 2 also shows how to configure two or more pattern elements. In FIG. 2, the depicted pattern elements extend mostly in the Y direction, and each pattern element is narrow in the X direction. With such pattern elements, the pattern elements should be divided into complementary pattern-element portions to ensure that the pattern elements are defined accurately. In this instance, the pattern elements in the Y direction are divided into complementary pattern-element portions depending upon the minimum width in which the pattern elements can be defined without substantial deformation of the pattern elements. Criteria for establishing adjacent subfield-boundary lines normally is 50 to 500 times the minimum width of the pattern elements.

In FIG. 2, the lines 21 and 24 are "initial" boundary lines for complementary subfields. These initial boundary lines are corrected so as to pass through nearby significant points (see the corrected boundary lines 23, 23' in FIG. 2). After correcting the boundary lines in this manner, pattern-element portions are assigned to the complementary subfields. In FIG. 2, pattern-element portions having odd reference numerals and pattern-element portions having even reference numerals are assigned to different (complementary) subfields so as to provide each subfield with increased rigidity and, hence, pattern-element fidelity.

As noted above, the initial subfield-boundary lines 21, 22, 24 are corrected, according to this embodiment, in part by considering the respective extensions of the pattern elements in each of the X and Y directions. For example, if the pattern-element extensions are mainly in the Y direction as shown in FIG. 2, then correction of the X-direction subfield-boundary lines 21, 24 (extending generally perpendicularly to the initial Y-dimension subfield-boundary lines 22) desirably is performed first. During correction, the X-direction subfield-boundary lines 21, 24 are shifted as required toward nearby significant points in the element crossed by the lines 21, 24. The range of "nearby" is determined in advance and, in this context, generally means in the range of up to 20 times the minimum linewidth from the respective subfield-boundary line. "Significant points" are as defined above. Significant points represent locations on the respective pattern elements at which the risk of a short, an open, or other circuit fault is relatively low, compared to other locations on the pattern elements, if there is a stitching error along the respective subfield-boundary line of the element as projected onto the substrate. Desirably, the corrected subfield-boundary lines cross over pattern elements at the fewest possible number of edges, so long as the corrected lines intersect nearby significant points. For example, in the Y direction in FIG. 2, the corrected Y-direction subfield-boundary line 25 does not cross over an edge of the pattern elements 33, 34, 45 but does intersect nearby significant points (four shown). Thus, the corrected subfield-boundary line 25 does not unnecessarily divide any pattern element into complementary pattern-element portions.

As noted above, the corrected subfield-boundary lines 23, 23' must cross over edges of pattern elements. However, the number of edges crossed is minimized as much as possible. If connecting two significant points results in the boundary line having a "slanted" or sloped profile inside the respective pattern element, then the division line desirably is further corrected to have a stepped profile inside the pattern element, which has been found to provide better stitching accuracy. For example, the boundary-line portion denoted "26" in FIG. 2 connects together the significant points $P_1$ and $P_2$. Since the points $P_1$ and $P_2$ are not at the same vertical "height" in the figure, a line connecting these points would have a sloped profile between the two points. To avoid the sloped profile, the boundary line is configured in the manner of the line portion 26, which has a stepped profile as it extends within the pattern element between the points $P_1$ and $P_2$. The stepped profile is made up of line portions that are parallel to the X-direction or Y-direction. Outside the pattern elements (where stitching is not an issue), it is immaterial whether boundary lines are "slanted." For example, note the slanted boundary line connecting together the significant points $P_3$ and $P_4$. Desirably, the slope of the slant is within the range of ±45° or within the range of ±135°, which has been found to provide better stitching accuracy.

Further with respect to FIG. 2, the corrected boundary lines 23, 23' divide the depicted pattern portion in a manner that produces the pattern-element portions 28–45. For example, the line 23 separates the pattern-element portions 38 and 39 from the pattern-element portions 28 and 29, and separates the pattern-element portions 35 and 36 from the pattern-element portions 31 and 32. After such division, note that the pattern-element portions 28 and 29 are still connected together, and the pattern-element portions 31 and 32 are still connected together. These connections result in respective peninsular non-exposed regions being situated between the pattern-element portions 28 and 29 and between the pattern-element portions 32 and 32. To avoid the peninsular problem (wherein the peninsulas are not self-supporting), the portions 28 and 29 are defined separately in complementary subfields; similarly, the portions 31 and 32 are defined in complementary subfields (thus, the portions 28, 30, and 32 are defined in one subfield, and the portions 29, 31, and 33 are defined in the complementary subfield). For similar reasons, the pattern-element portions 38 and 39 are defined in separate complementary subfields, the portions 36 and 37 are defined in separate complementary subfields, and the portions 34 and 35 are defined in separate complementary subfields (thus, the portions 35, 37, and 39 are defined in one subfield, and the portions 34, 36, and 38 are defined in the complementary subfield). For similar reasons, the pattern-element portions 40, 42, and 44 are defined in one subfield, and the pattern-element portions 41, 43, and 45 are defined in a complementary subfield. (Note the line 26 separating the pattern-element portions 28 and 29 destined to be in complementary subfields, and the line 27 separating the pattern-element portions 31 and 32 destined to be in complementary subfields.)

As used herein, subfields that are "complementary" to each other encompass the same corresponding region of a pattern, but define different pattern elements or portions of pattern elements in that region. Complementary subfields must be exposed in separate respective "shots" onto the same corresponding region of the substrate. A particular subfield can be divided into two or more complementary subfields.

Complementary subfields can be defined on the same reticle as their counterpart subfields, or, alternatively, defined on separate reticles. For pattern elements that are not split by the corrected subfield-boundary lines, complementary division of the elements nevertheless can be performed as required so that pattern elements having minimal distance therebetween are arranged on complementary subfields. Alternatively, for pattern elements that are not split by the corrected subfield-boundary lines, complementary division of the elements nevertheless can be performed as required so that the pattern elements that are arranged on the complementary subfields can have maximal separation therebetween on each subfield.

If a subfield pattern resulting from the initial division of the reticle pattern includes non-exposed regions that are "islands" (i.e., surrounded by an exposed region in the manner of a donut), then it is desirable that a corrected boundary line be located so as to extend along an edge of the non-exposed region to avoid the donut problem. In general, such shifting is indicated especially if the donut-shaped exposed region is within a distance of 50 times the minimum linewidth from the initial subfield-boundary line.

In FIG. 2, as a result of correcting the subfield boundaries in the manner shown, a first pattern-element portion and a second pattern-element portion that are contiguous with each other across a subfield boundary are relegated to respective complementary subfields. Similarly, pattern-element portions that are contiguous with each other on the same side of a boundary line (e.g., portions 28 and 29) also are relegated to complementary subfields. On the other hand, pattern-element portions that are more than a minimal distance from each other in the same subfield (e.g., portions 35, 37, 39) are left in the same subfield.

Figure 3:
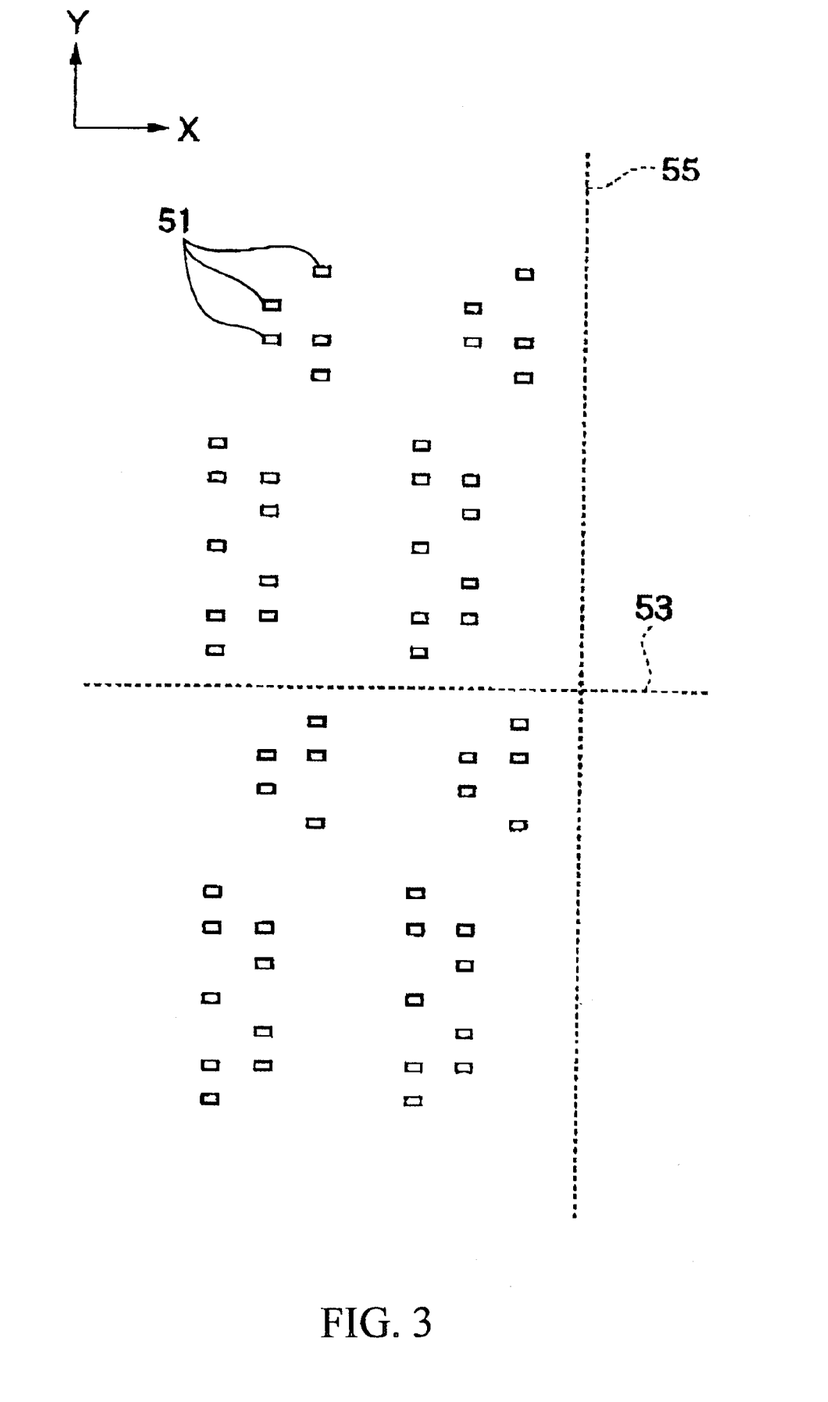
FIG. 3 is a plan view schematically showing the relationship between an exemplary array of pattern elements for a contact-hole layer and the subfield boundary, wherein pattern division has been performed according to the third representative embodiment.

A third representative embodiment is shown in FIG. 3, depicting a scheme for dividing a pattern that comprises multiple small pattern elements. I.e., FIG. 3 is a plan view schematically depicting exemplary individual elements 51 of a pattern of contact holes. Subfield boundaries 53, 55 are shown. The elements 51 are arrayed similarly in each subfield. Since the elements 51 are small and scattered well apart from one another, they do not intersect with the boundary lines 53, 55. Hence, there is no need to divide the pattern into complementary subfields, and no need to correct the boundary lines 53, 55 in a manner that would link together significant points of the pattern elements.

Figure 7:
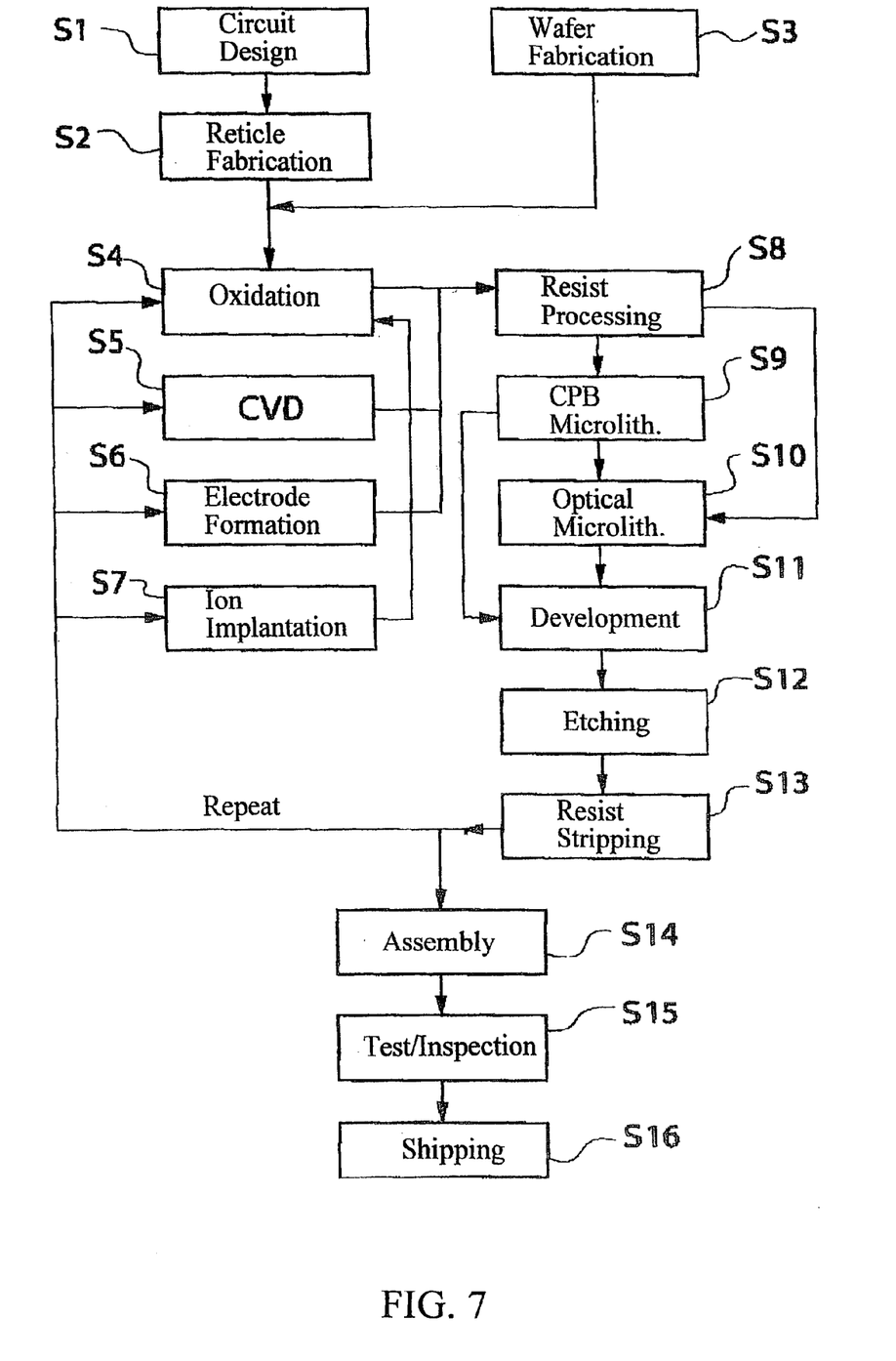
FIG. 7 is a flowchart of steps in a process for manufacturing a microelectronic device such as a semiconductor chip (e.g., integrated circuit or LSI), liquid-crystal panel, CCD, thin-film magnetic head, or micromachine, the process including performing microlithography using a microlithography apparatus according to the invention.

FIG. 7 is a flow chart of steps in a process for manufacturing a microelectronic device such as a semiconductor chip (e.g., an integrated circuit or LSI device), a display panel (e.g., liquid-crystal panel), charged-coupled device (CCD), thin-film magnetic head, micromachine, for example. In step S1, the circuit for the device is designed. In step S2 a reticle ("mask") for the circuit is manufactured. In step S2, local resizing of pattern elements can be performed to correct for proximity effects or space-charge effects during exposure. In step S3, a wafer is manufactured from a material such as silicon.

Steps S4–S13 are directed to wafer-processing steps, in which the circuit pattern defined on the reticle is transferred onto the wafer by microlithography. Step S14 is an assembly step (also termed a "post-process" step) in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability and qualification tests of the device produced in step S14 are conducted. Afterward, devices that successfully pass step S15 are finished, packaged, and shipped (step S16).

Steps S4–S13 also provide representative details of wafer processing. Step S4 is an oxidation step for oxidizing the surface of a wafer. Step S5 involves chemical vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves microlithographically exposing the resist using a charged particle beam to as to imprint the resist with the reticle pattern of the reticle produced in step S2. In step S9, a CPB microlithography apparatus as described above can be used. Step S10 involves microlithographically exposing the resist using optical microlithography. This step also can be performed using a reticle produced in step S2 can be used. Step S11 involves developing the exposed resist on the wafer. Step S12 involves etching the wafer to remove material from areas where developed resist is absent. Step S13 involves resist separation, in which remaining resist on the wafer is removed after the etching step. By repeating steps S4–S13 as required, circuit patterns as defined by successive reticles are formed superposedly on the wafer.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam microlithography method in which a pattern, defined on a segmented reticle in which the pattern is divided into multiple subfields, is transfer-exposed by a charged particle beam from the reticle to a sensitive substrate where images of the subfields are positioned so as collectively to form the entire pattern on the substrate, a method for dividing the pattern into subfields, comprising:
    performing an initial division of the reticle pattern using initial subfield-boundary lines spaced apart from one another according to a subfield dimension determined in advance; and
    correcting the initial subfield-boundary lines to produce corrected subfield-boundary lines so as to correct pattern-element stitching when the pattern is transfer-exposed to the sensitive substrate.

2. The method of claim 1, wherein:
    the pattern elements as defined on the reticle are arranged at certain respective pitches in the X direction and in the Y direction; and
    the initial subfield-boundary lines are established at respective integer multiples of the respective pitches without, thereby, defining subfields that are larger than a maximum subfield size that can be exposed without excessive aberrations.

3. The method of claim 2, further comprising the step of further dividing the subfields as required into respective complementary subfields.

4. The method of claim 3, wherein, in the reticle subfields that are divided into respective complementary subfields, each respective reticle subfield is divided by at least one line extending in the X or Y direction at an interval of ¼ of the respective pitch or an integer multiple of ¼ of the respective pitch.

5. The method of claim 3, wherein:
    the reticle pattern has a minimum linewidth; and
    the respective integer multiples are within a range of 50 to 500 times the minimum linewidth.

6. The method of claim 1, wherein:
    the reticle pattern extends in X and Y directions along at least one of which the reticle pattern exhibits a cyclical period repeat; and
    the initial division step comprises placing the initial subfield-boundary lines at an integer multiple of half the period repeat.

7. The method of claim 1, wherein:
    at least some of the pattern elements include one or more significant points; and
    regarding the respective adjacent pattern elements, if the significant points are located within a predetermined distance from the respective initial subfield-boundary lines, then the initial subfield-boundary lines are corrected by shifting the respective lines so as to intersect the significant points.

8. The method of claim 7, wherein an initial subfield-boundary line is shifted to intersect a significant point of a respective adjacent pattern element if the respective significant point defines an interior angle of at least 180°.

9. The method of claim 8, wherein, if the respective significant point does not define an interior angle of at least 180°, then the initial subfield-boundary line is shifted to intersect a significant point of a respective adjacent pattern element if the respective significant point defines an interior angle of less than 180°.

10. The method of claim 8, wherein:
    the reticle pattern extends in X and Y directions along at least one of which the reticle pattern exhibits a regular cyclical repeat having a respective pitch; and
    in the X or Y direction in which the reticle pattern exhibits the regular cyclical repeat, the corrected subfield-boundary line extends through significant points located, relative to the respective initial subfield-boundary line, within ½ the respective pitch.

11. The method of claim 7, wherein the correcting step comprises configuring the corrected subfield-boundary lines so as to intersect as few adjacent pattern elements as possible while intersecting the respective significant points.

12. The method of claim 7, wherein:
    the reticle pattern extends in X and Y directions;
    in the initial-division step the initial subfield-boundary lines are configured to extend in the X and Y directions; and
    in the correcting step each corrected subfield line is configured to extend, within a respective pattern element, in at least one of the X and Y directions as the corrected subfield line connects together respective significant points of the respective pattern element.

13. The method of claim 12, wherein, in the correcting step each corrected subfield line is configured to extend, outside a respective pattern element, parallel to at least one of the X and Y directions or at a slope relative to at least one of the X and Y directions.

14. The method of claim 13, wherein the slope is within a range of ±45° or ±135° relative to the X or Y direction.

15. The method of claim 7, wherein:
    the reticle pattern extends in X and Y directions along at least one of which the reticle pattern exhibits a cyclical period repeat; and
    the initial division step comprises placing the initial subfield-boundary lines at an integer multiple of half the period repeat.

16. The method of claim 7, wherein the correcting step further comprises:
    evaluating the reticle pattern for any donut-shaped pattern elements defined as a respective non-exposure region surrounded by a respective exposure region; and
    if a donut-shaped pattern element is within a predetermined distance from an initial subfield-boundary line, then shifting the initial subfield-boundary line so as to form a respective corrected subfield-boundary line extending along at least one edge of the non-exposure region of the donut-shaped pattern element.

17. The method of claim 1, wherein:
    the reticle pattern has a minimum linewidth;
    at least some of the pattern elements include one or more significant points;
    the initial subfield-boundary lines extend relative to respective adjacent pattern elements; and regarding the respective adjacent pattern elements, if the significant points are located within 20 times the minimum linewidth of the respective initial subfield-boundary lines, then the initial subfield-boundary lines are corrected by shifting the respective lines so as to intersect the significant points.

18. The method of claim 17, wherein an initial subfield-boundary line is shifted to intersect a significant point of a respective adjacent pattern element if the respective significant point defines an interior angle of at least 180°.

19. The method of claim 18, wherein:

the reticle pattern extends in X and Y directions along at least one of which the reticle pattern exhibits a regular cyclical repeat having a respective pitch; and in the X or Y direction in which the reticle pattern exhibits the regular cyclical repeat, the corrected subfield-boundary line extends through significant points located, relative to the respective initial subfield-boundary line, within ½ the respective pitch.

20. The method of claim 17, wherein, if the respective significant point does not define an interior angle of at least 180°, then the initial subfield-boundary line is shifted to intersect a significant point of a respective adjacent pattern element if the respective significant point defines an interior angle of less than 180°.

21. The method of claim 17, wherein the correcting step comprises configuring the corrected subfield-boundary lines so as to intersect as few adjacent pattern elements as possible while intersecting the respective significant points.

22. The method of claim 17, wherein the correcting step further comprises:

evaluating the reticle pattern for any donut-shaped pattern elements defined as a respective non-exposure region surrounded by a respective exposure region; and if a donut-shaped pattern element is within a predetermined distance from an initial subfield-boundary line, then shifting the initial subfield-boundary line so as to form a respective corrected subfield-boundary line extending along at least one edge of the non-exposure region of the donut-shaped pattern element.

23. The method of claim 17, wherein:

the reticle pattern extends in X and Y directions;

in the initial-division step the initial subfield-boundary lines are configured to extend in the X and Y directions; and in the correcting step each corrected subfield line is configured to extend, within a respective pattern element, in at least one of the X and Y directions as the corrected subfield line connects together respective significant points of the respective pattern element.

24. The method of claim 23, wherein, in the correcting step each corrected subfield line is configured to extend, outside a respective pattern element, parallel to at least one of the X and Y directions or at a slope relative to at least one of the X and Y directions.

25. The method of claim 24, wherein the slope is within a range of ±45° or ±135° relative to the X or Y direction.

26. The method of claim 1, wherein:

the reticle pattern has a minimum linewidth;

at least some of the pattern elements include one or more significant points;

the initial subfield-boundary lines extend relative to respective adjacent pattern elements; and regarding the respective adjacent pattern elements, if the significant points are located within a distance, determined in advance, no greater than 20 times the minimum linewidth of the respective initial subfield-boundary lines, then the initial subfield-boundary lines are corrected by shifting the respective lines so as to intersect the significant points.

27. The method of claim 26, wherein an initial subfield-boundary line is shifted to intersect a significant point of a respective adjacent pattern element if the respective significant point defines an interior angle of at least 180°.

28. The method of claim 27, wherein:

the reticle pattern extends in X and Y directions along at least one of which the reticle pattern exhibits a regular cyclical repeat having a respective pitch; and in the X or Y direction in which the reticle pattern exhibits the regular cyclical repeat, the corrected subfield-boundary line extends through significant points located, relative to the respective initial subfield-boundary line, within ½ the respective pitch.

29. The method of claim 26, wherein, if the respective significant point does not define an interior angle of at least 180°, then the initial subfield-boundary line is shifted to intersect a significant point of a respective adjacent pattern element if the respective significant point defines an interior angle of less than 180°.

30. The method of claim 26, wherein the correcting step comprises configuring the corrected subfield-boundary lines so as to intersect as few adjacent pattern elements as possible while intersecting the respective significant points.

31. The method of claim 26, wherein the correcting step further comprises:

evaluating the reticle pattern for any donut-shaped pattern elements defined as a respective non-exposure region surrounded by a respective exposure region; and if a donut-shaped pattern element is within a predetermined distance from an initial subfield-boundary line, then shifting the initial subfield-boundary line so as to form a respective corrected subfield-boundary line extending along at least one edge of the non-exposure region of the donut-shaped pattern element.

32. The method of claim 26, wherein:

the reticle pattern extends in X and Y directions;

in the initial-division step the initial subfield-boundary lines are configured to extend in the X and Y directions; and in the correcting step each corrected subfield line is configured to extend, within a respective pattern element, in at least one of the X and Y directions as the corrected subfield line connects together respective significant points of the respective pattern element.

33. The method of claim 32, wherein, in the correcting step each corrected subfield line is configured to extend, outside a respective pattern element, parallel to at least one of the X and Y directions or at a slope relative to at least one of the X and Y directions.

34. The method of claim 33, wherein the slope is within a range of ±45° or ±135° relative to the X or Y direction.

35. A reticle, defining a pattern divided by a method as recited in claim 1.

36. A charged-particle-beam microlithography process, comprising:

defining a pattern on a reticle divided by a method as recited in claim 1; and using a charged particle beam, transferring the pattern from the reticle to a substrate.

37. A method for manufacturing a microelectronic device, comprising a microlithography process as recited in claim 36.

* * * * *

UNITED STATES PATENT AND TRADEMARK OFFICE
CERTIFICATE OF CORRECTION

PATENT NO. : 6,591,412 B2
DATED : July 8, 2003
INVENTOR(S) : Nakasuji

It is certified that error appears in the above-identified patent and that said Letters Patent is hereby corrected as shown below:

Title page, Item [54] and Column 1, lines 1-4,
Title, "METHODS FOR DIVIDING A PATTERN IN A SEGMENTED RETICLE FOR CHARGED-PARTICLE-BEAM MICROLITHOGRAPHY" should be
-- METHODS FOR DIVIDING A PATTERN IN A SEGMENTED RETICLE FOR CHARGED-PARTICLE-BEAM MICROLITHOGRAPHY AND RETICLES PRODUCED BY SUCH METHODS --

Column 11,
Line 10, ">180°" should be -- $\geq 180°$ --.

Signed and Sealed this

Eleventh Day of May, 2004

JON W. DUDAS
*Acting Director of the United States Patent and Trademark Office*